United States Patent [19]

Staudinger

[11] Patent Number: 4,635,341

[45] Date of Patent: Jan. 13, 1987

[54] VARIABLE CENTER DISTANCE INSERTION DEVICE

[75] Inventor: Frank X. Staudinger, Orlando, Fla.

[73] Assignee: Martin Marietta Corporation, Bethesda, Md.

[21] Appl. No.: 610,462

[22] Filed: May 15, 1984

[51] Int. Cl.[4] .............................. B21F 1/00; H05K 3/30
[52] U.S. Cl. ....................................... 29/566.3; 29/703; 29/741; 29/838
[58] Field of Search ................ 29/564.6, 741, 743, 29/702, 703, 564.8, 566.3, 566.2, 566.1, 737, 738; 140/105; 227/90

[56] References Cited

U.S. PATENT DOCUMENTS

| | | | |
|---|---|---|---|
| 2,982,967 | 5/1961 | Dingelstedt | 227/90 |
| 3,593,404 | 7/1971 | Ragard | 29/566.1 X |
| 3,780,415 | 12/1973 | Ragard | 227/90 |
| 4,068,373 | 1/1978 | Bell et al. | 29/741 |
| 4,087,034 | 5/1978 | Kikkawa et al. | 29/566.1 X |
| 4,202,092 | 5/1980 | Shibasaki et al. | 29/741 |
| 4,205,433 | 6/1980 | Araki et al. | 29/741 X |
| 4,245,385 | 1/1981 | Zemek et al. | 29/564.8 |
| 4,312,109 | 1/1982 | Kawana et al. | 29/564.6 |

*Primary Examiner*—Z. R. Bilinsky
*Attorney, Agent, or Firm*—Julian C. Renfro; Gay Chin; Patrick M. Hogan

[57] ABSTRACT

A variable center distance insertion device for attaching varying sized parts which have leads extending therefrom to a board, such as a printed circuit board, having holes therethrough. The device includes an inserter assembly disposed above the board and an anvil assembly disposed below the board. The inserter assembly and the anvil assembly each includes an arrangement of a motor, a threaded spindle and nuts which permit adjustment of the bending, cutting, inserting and clinching components of the two assemblies to positions adjacent the holes into which the leads of the parts are to be inserted.

26 Claims, 8 Drawing Figures

VARIABLE CENTER DISTANCE INSERTION DEVICE

BACKGROUND OF THE INVENTION

1. Field of the Invention

This invention relates to insertion devices for inserting leads of parts into holes in a board to thereby attach the part to the board, and particularly to a new and improved variable center distance insertion device which permits attachment of varying sized parts to a printed circuit board by adjustment of components of the device to match the varying distances between holes associated with the parts.

2. Description of the Prior Art

Printed circuit boards are used extensively in the electronics industry due to their reliability and modular nature. A circuit board includes holes drilled therethrough which are interconnected with various patterns of conductive material. Electronic parts are then mounted on the board, each part including two leads extending therefrom which are bent to right angles, inserted into two holes and then clinched toward the bottom face of the board, thus attaching the part to the board and completing the electronic circuit.

Insertion devices have been developed which include components to perform the bending, inserting and clinching operations on the leads. These devices are relatively uncomplicated when all the parts to be attached to the board are of the same size, since the components which perform the above operations can be prefabricated according to a constant spacing between holes. Difficulties arise, however, when parts of varying sizes are to be attached to a board in that the center distance spacing between the two holes and leads associated with one sized part is larger or smaller than the center distance spacing between holes and leads associated with another sized part.

One approach to this problem has been to employ multiple sets of components within a single device, one set associated with each size part. Although such an arrangement will achieve the desired results, the multiplicity of components makes the device bulky, complex and expensive. Additionally, the range of sizes of parts which can be attached to a board is limited to the number of sets of components in the device.

In view of the above, it is therefore an object of the present invention to provide a variable center distance insertion device having a single set of components for attaching various sized parts to a board.

Another object of the present invention is to provide a variable center distance insertion device which is compact and relatively simple and of reasonable cost.

Yet another object of the present invention is to provide a variable center distance insertion device capable of adjusting to an unlimited range of sizes.

SUMMARY OF THE INVENTION

The present invention, in accordance with one embodiment thereof, comprises a variable center distance insertion device for attaching a part which has two leads extending therefrom to a board having holes therein. The device includes an inserter assembly having first and second retainers which are translatable so as to be positionable adjacent the holes into which the leads will be inserted. The device further includes an anvil assembly having first and second heads which are also translatable so as to be positionable adjacent the holes. Connected to the first and second retainers are bending means for bending the leads and inserter means for inserting the leads into the holes. Connected to the first and second heads are clinching means for clinching the leads toward the bottom base of the board. The device further includes synchronizing means for enabling simultaneous translation of the first retainer with the first head and of the second retainer with the second head.

In a particular embodiment of the invention, the first and second retainers also include initial cutting means for cutting the leads to a desired initial length before insertion into the holes and the first and second heads include final cutting means for cutting the leads to final lengths after they have been inserted through the holes.

BRIEF DESCRIPTION OF THE DRAWING

This invention will be better understood from the following description when taken in conjunction with the accompanying drawing, wherein.

FIG'S. 2 and 2A are cross-sectional views showing parts which have been attached to a board using the device of the present invention.

DESCRIPTION OF THE PREFERRED EMBODIMENT

Figure 1:
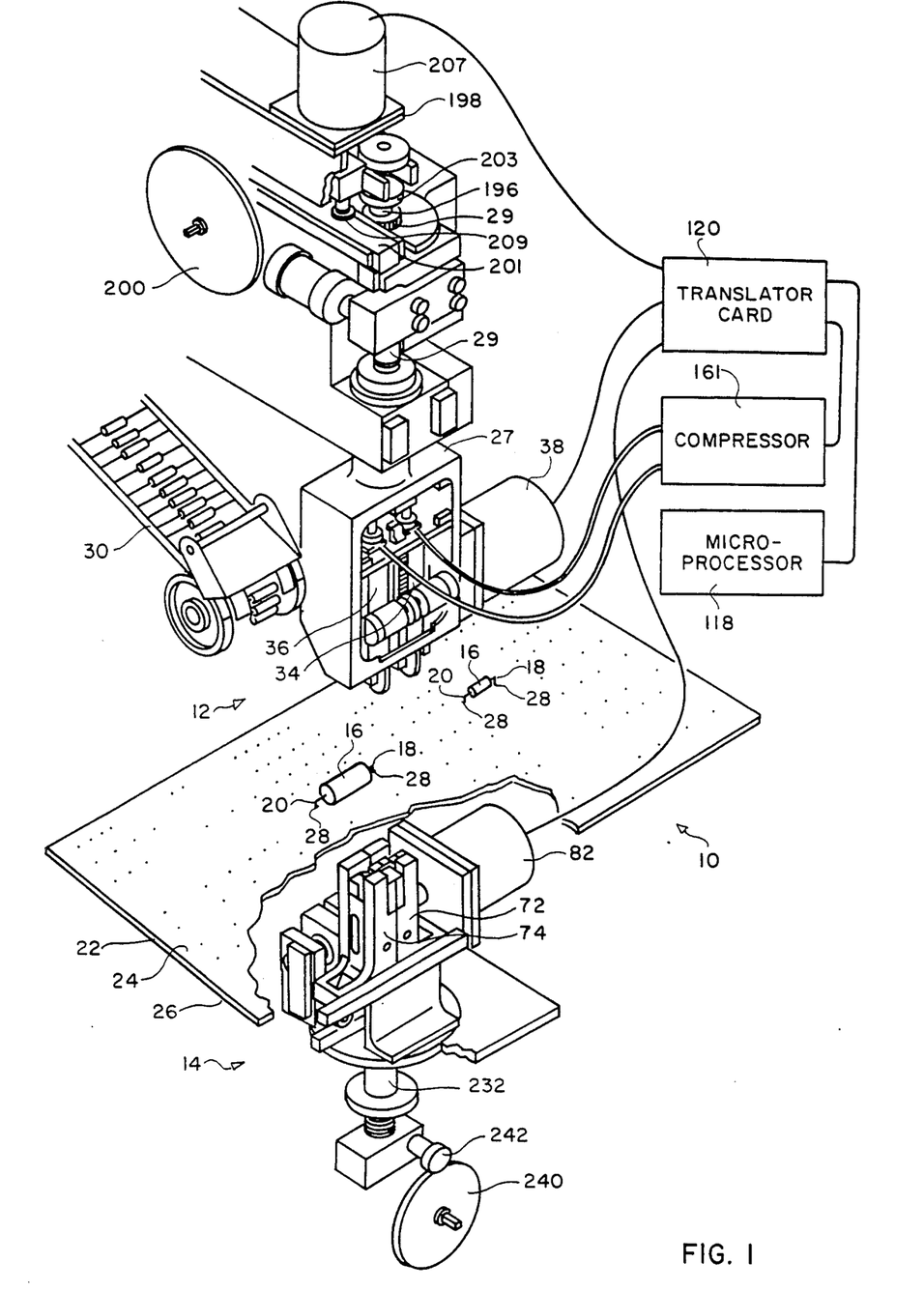
FIG. 1 is a perspective view of the VCD insertion device and FIG. 1A is an enlarged view of a portion thereof.
Figure 2:
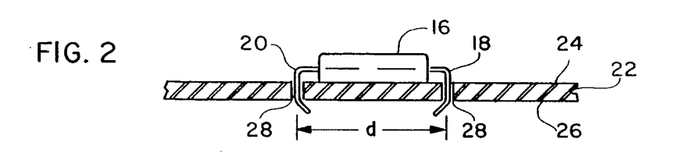

Turning now to a consideration of the drawing, and in particular to FIG. 1, there is shown the variable center distance (VCD) insertion device 10 of the present invention. The major components of the VCD insertion device 10 are the inserter assembly 12 and the anvil assembly 14. Briefly referring to FIG. 2, the function of the VCD insertion device 10 is to attach a part 16, such as an electronic component, which has a first lead 18 and a second lead 20 extending axially therefrom, to a board 22. The board 22 has a top face 24, a bottom face 26 and a plurality of holes 28 therethrough. The part 16 is attached to the board 22 by bending the first and second leads 18 and 20 and then inserting the leads through the holes 28, which are a distance d apart, and clinching the ends of the leads 18 and 20 at an angle so as to prevent the leads from being pulled out of the holes.

Figure 2A:
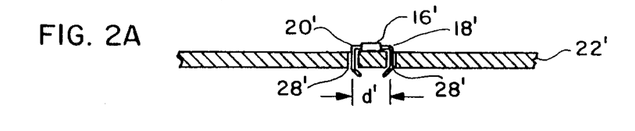

One of the unique features of the VCD insertion device 10 is its capability of automatically adjusting its own internal components to match varying center distances d between the centers of holes 28 into which the first and second leads 18 and 20 of varying sized parts 16 will be inserted. For example, comparing FIG. 2 ad 2A, it can be seen that the part 16' is mucn smaller than part 16 and thus the center distance d' between holes 28' is also smaller than the center distance d between holes 28. The insertion device 10 of the present invention will automatically adjust its internal components from an initial position adjacent the holes 28 which accommodates the cutting, bending, inserting and clinching of tne leads of the parts 16 to a second position adjacent the holes 28' which accommodates the cutting, bending, inserting and clinching of the leads of the part 16'. The maximum and minimum limits of adjustment of the device 10 can be set as desired, depending upon the maximum and minimum sizes of the parts 16 which are being used. The device 10 eliminates the need for multiple sets of components as in prior art devices and is thus compact, relatively simple and of reasonable cost.

Returning to FIG. 1, it can be seen that the inserter assembly 12 is disposed adjacent the top face 24 of the board 22 while the anvil assembly 14 is disposed adjacent the bottom face 26 of the board 22. The inserter assembly 12 is supported by and is encased within a support frame 27 which includes a hollow tubular member 29 extending vertically therefrom. A part 16 is delivered to the inserter assembly 12, such as from a component tape 30, in any appropriate manner. As will be described in more detail hereinafter, the inserter assembly 12 automatically adjusts its internal components in accordance with the distance between the holes 28 into which the leads of the part 16 will be inserted. The inserter assembly 12 then cuts the first and second leads 18 and 20 to predetermined lengths, bends the leads to right angles, and inserts the leads into the holes 28.

As the first and second leads 18 and 20 protrude through the bottoms of the holes 28, the anvil assembly 14, whose internal components have also been adjusted in accordance with the distance between the holes 28 of the particular part being inserted, makes a final cut of the ends of the first and second leads 18 and 20 and clinches the leads so as to attach the part 16 to the board 22. The board 22 can then be repositioned relative to the inserter and anvil assemblies 12 and 14 so as to enable another part 16 of the same or different size to be attached to the board in the same manner.

Figure 3:
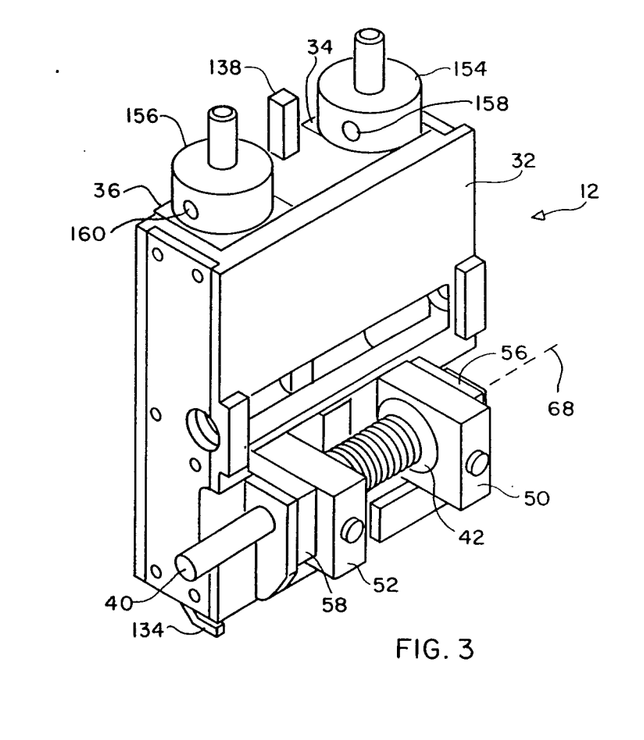
FIG. 3 is a perspective view of the inserter assembly.
Figure 4:
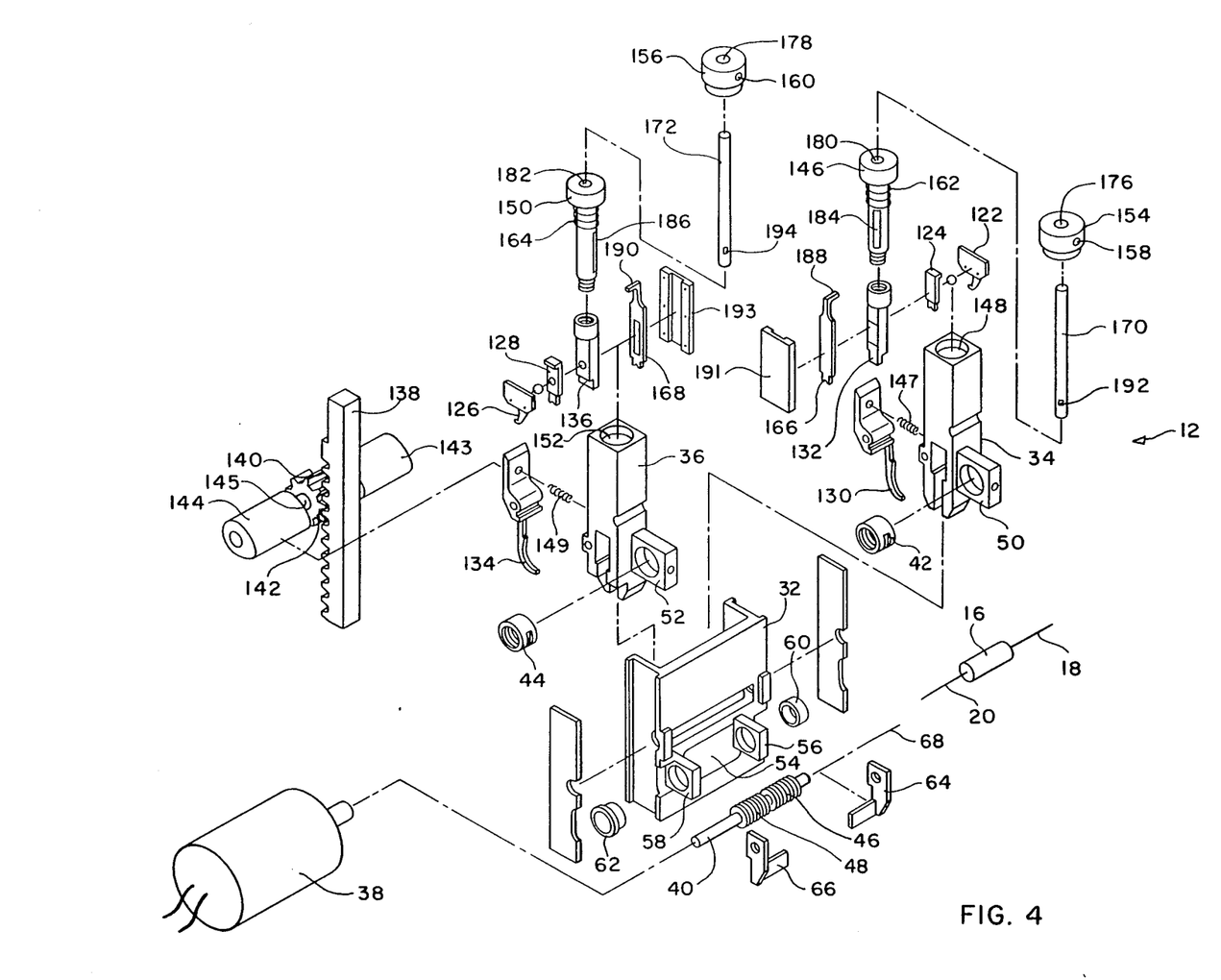
FIG. 4 is an exploded perspective view of the components of the inserter assembly.

Reference is now made to FIG. 3 which shows the inserter assembly 12 assembled and FIG. 4 which is an exploded view. The inserter assembly 12 includes a body 32, a first retainer 34 and a second retainer 36. The first and second retainers 34 and 36 are connected with the body 32 in a manner such that they are translatable relative to each other and to the body 32. This translational capability permits the earlier mentioned automatic adjustment of components to match varying distances between holes 28 in a board 22. An example of suitable means for selectively translating the first and second retainers 34 and 36 to positions adjacent the holes 28 is shown in FIG. 4 and comprises an arrangement of a motor 38, a threaded spindle 40 and nuts 42 and 44. The spindle 40 has left hand threads 46 and right hand threads 48 (or vice versa). The nuts 42 and 44 are attached to or are integral with protrusions 50 and 52 of the first and second retainers 34 and 36, respectively. The protrusions 50 and 52 extend through an opening 54 in the body 32 such that they are aligned with the spindle brackets 56 and 58 which extend from the body 32. The spindle brackets 56 and 58 preferably include bushings 60 and 62 to support the spindle 40 and spindle keepers 64 and 66 to help retain spindle 40 and bushings 60 and 62 in place. When assembled, as is shown in FIG. 3, the left hand threads 46 of the spindle 40 extend through and match the threads of the nut 42 while the right hand threads extend through tne match the threads of the nut 44. Thus, rotation of the spindle 40 effects translation of the protrusions 50 and 52 and therefore of the first and second retainers 34 and 36 in opposite directions and parallel to the axis, designated by the dashed line 68, of the spindle 40.

Figure 5:
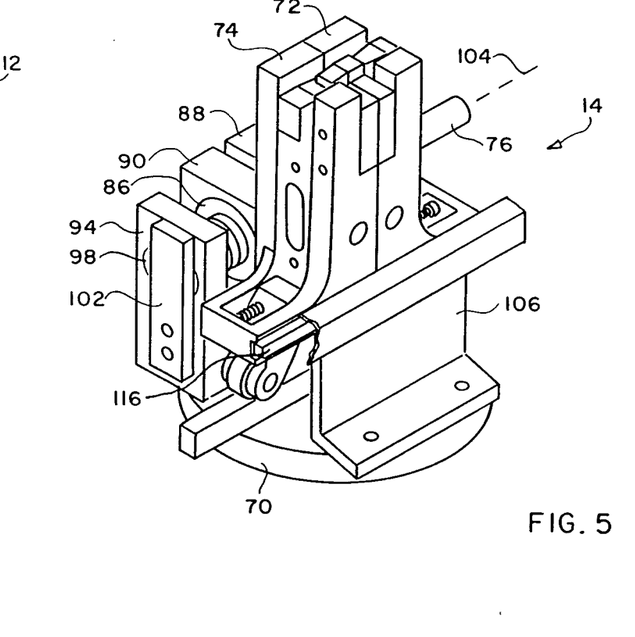
FIG. 5 is a perspective view of the anvil assembly.
Figure 6:
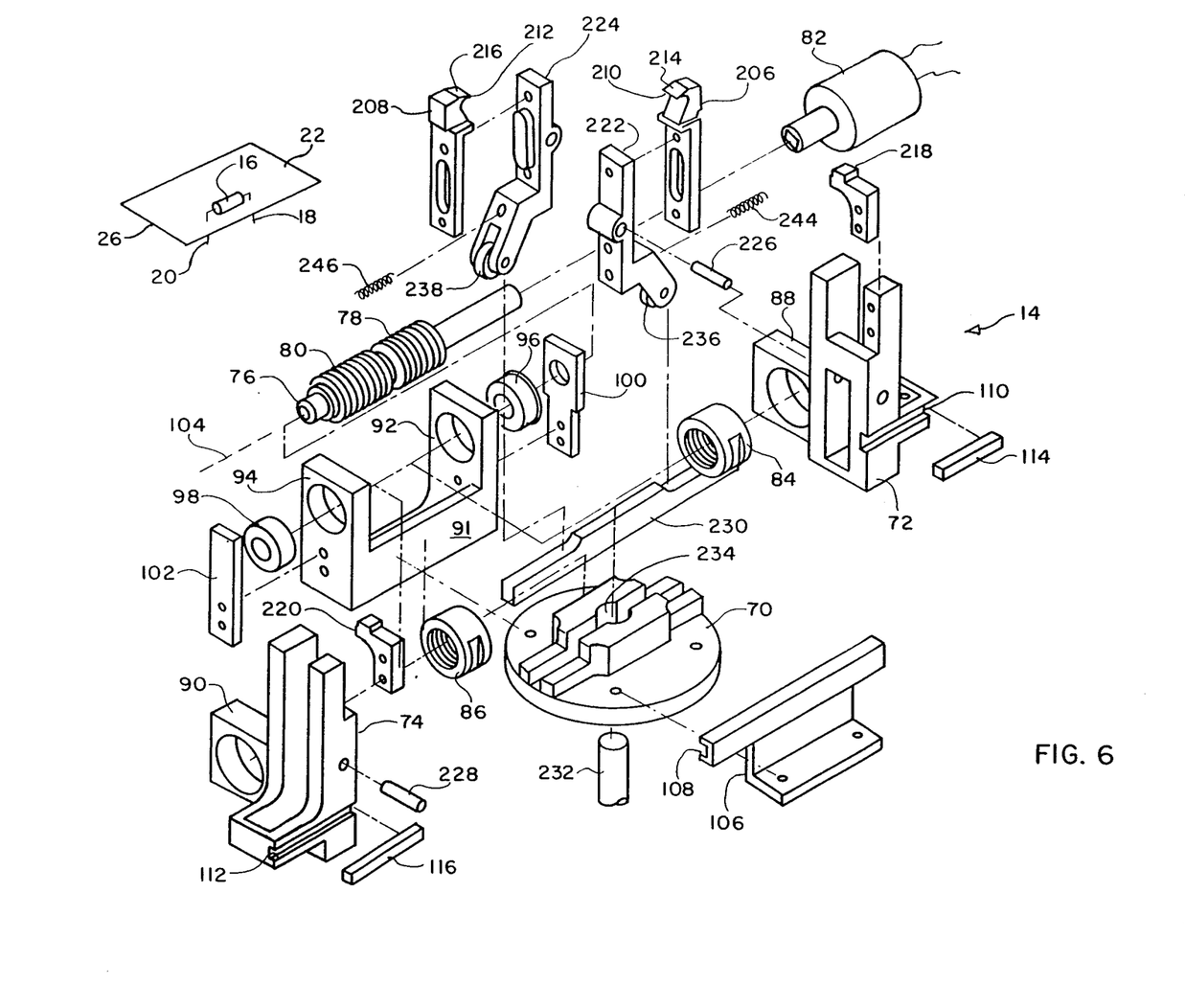
FIG. 6 is an exploded perspective view of the components of the anvil assembly.

Referring to FIG. 5, which shows the anvil assembly 14 in its assembled configuration and to FIG. 6 which is an exploded view, it can be seen that the anvil assembly 14 includes an arrangement similar to that of the inserter assembly 12 for permitting automatic adjustment of components in accordance with the varying distances between holes 28 and a board 22. The anvil assembly 14 includes a base 70, a first head 72 and a second head 74. The first and second heads 72 and 74 are connected with the base 70 in a manner such as they are translatable relative to each other and to the base. An example of suitable means for selectively translating the first and second heads 72 and 74 to positions adjacent to holes 28 comprises a spindle 76 having left hand threads 78 and right hand threads 80 (or vice versa), a motor 82 to rotate the spindle 76 and nuts 84 and 86 which are attached to or are integral with extensions 88 and 90 of the first and second heads 72 and 74, respectively. A bracket 91 includes flanges 92 and 94 and is mounted on the base 70 and can include bushings 96 and 98 to support the spindle 76 and spindle keepers 100 and 102 to retain the bushings and spindle in place. When assembled, the extensions 88 and 90 of the first and second heads 72 and 74 fit between the flanges 92 and 94 with the left hand threads 78 of the spindle 76 extending into and matching the threads of the nut 84 while the right hand threads 80 of the spindle extend into and match the threads of the nut 86. Rotation of the spindle 76 effects translation of the extensions 88 and 90 and therefore of the first and second heads 72 and 74 in opposite directions either toward or away from the center of the anvil assembly 14 and parallel to the axis, designated by the dashed line 104, of the spindle 76. To assist in smooth translation, the anvil assembly can include an anvil rail 106 which is mounted on the base 70 and having an elongated slot 108 therein. The first and second heads 72 and 74 each also includes an elongated slot 110 and 112, respectively, tnerein. A first rail key 114 and a second rail key 116 are inserted into and fixedly attached to the slots 110 and 112, respectively, of the first and second heads 72 and 74 and also into the slot 108 of the anvil rail 106 so as to provide a sliding support to tne first and second heads 72 and 74 as they translate back and forth. Employment of the spindle 76 for the anvil assembly 14 as well as of the spindle 40 for the inserter assembly 12 (FIG. 4) permits adjustments of the first and second heads and retainers 72, 74, 34 and 36, respectively, to an unlimited range of positions within the maximum and minimum limits of the device.

Returning to FIG. 1, the VCD insertion device 10 includes synchronizing means for enabling simultaneous translation of the first retainer 34 with the first head 72 and of the second retainer 36 with the second head 74. Such simultaneous translation permits the first retainer and first head to perform the cutting, bending, inserting and clinching functions as a pair and the second retainer and second head to do the same. An example of suitable synchronizing means comprises a microprocessor 118, which has been programmed with the locations of and distances between the holes 28 in the board 22 to which parts 16 are being attached, and a translator card 120 which receives instructions from the microprocessor 118 and sends appropriate electrical signals to the motors 38 and 82 such that the motors will operate in unison. Preferably, the motors 38 and 82 are stepper motors which provide feedback to the microprocessor 118 of the amount of their rotation, and thus of the positions of the first and second retainers 34 and 36 and of the first and second heads 72 and 74.

The above description has detailed the configuration of the portion of the VCD insertion device 10 which permits automatic adjustment of its components in accordance with varying distances between holes 28 in a board 22 to which parts 16 are to be attached.

The following description details the components of the VCD insertion device 10 which perform the initial cutting, bending, inserting, final cutting and clinching actions and which are mounted on or connected with the adjustable first and second retainers 34 and 36 or the first and second heads 72 and 74.

Referring to FIG. 4, the inserter assembly 12 preferably includes components which perform cutting, bending and inserting actions on the first and second leads 18 and 20 of a part 16. Any suitable cutting, bending and inserting arrangements can be employed and the following arrangements are presented as examples only. More specifically, for the cutting action, the first and second retainers 34 and 36 include first and second initial cutting means, respectively, configured such that they are translatable with the first and second retainers. Preferably, the first initial cutting means comprises a stationary outer cutter 122 and a translatable inner cutter 124 and the second initial cutting means comprises a stationary outer cutter 126 and a translatable inner cutter 128. The outer cutters 122 and 126, each of which has a cutting edge across which the first and second leads 18 and 20 of a part 16 lie, are rigidly attached to the first and second retainers 34 and 36, respectively. Each of the inner cutters 124 and 128 is configured to translate adjacent the cutting edge of an outer cutter to engage one of the leads 18 or 20 and shear the lead at the cutting edge of the outer cutter. The means for effecting translation of the inner cutters 124 and 128 will be described hereinafter.

To accomplish the bending action, the first and second retainers 34 and 36 include first and second bending means connected thereto, respectively. Preferably, the first bending means comprises a pivotable arm 130 and a translatable bender 132 and the second bending means comprises a pivotable arm 134 and a translatable bender 136, as well as means for translating the benders 132 and 136. During the bending action, the arms 130 and 134, which are pivotally connected with the first and second retainers, respectively, are positioned such that the first and second leads 18 and 20 of a part 16 extend across the arms while the benders 132 and 136 translate adjacent the arms 130 and 134 and engage the leads, bending the leads over the arms to approximately a right angle. Prior to the first and second leads 18 and 20 being inserted into holes 28 in a board 22, the arms 130 and 134 are pivoted away from the leads so as not to interfere with their insertion. The pivoting of the arms 130 and 134 is preferably accomplished by means of a camming arrangement.

The camming arrangement preferably comprises an elongated rack 138 which includes teeth 140 thereon, a spur gear 142 having teeth configured to mesh with the teeth 140 of the rack 138, and cams 143 and 144 connected with the spur gear 142 by a shaft 145 such that they rotate with the spur gear. As the rack 138 is translated vertically, in a manner to be discussed hereinafter, the meshed teeth of the spur gear 142 and of the rack 138 effect rotation of the spur gear 142 and of the cams 143 and 144. The cams 143 and 144 are positioned against the surface of the arms 130 and 134, respectively, such that as the cams rotate, they effect pivotal motion of the arms. Resilient means, such as the springs 147 and 149, return the arms 130 and 134 to their original positions.

The translation of the inner cutters 124 and 128 and of the benders 132 and 136 can be accomplished in any desired manner. One suitable example is shown in FIG. 4 as a piston 146 which fits in a cylinder 148 within the first retainer 34, and another piston 150 which fits in a cylinder 152 within the second retainer 36. The pistons 146 and 150 are connected to the benders 132 and 136, respectively, in an appropriate manner, such as by screwing them together, and the inner cutters 124 and 128 are attached to the benders 132 and 136, respectively, such that each piston and its inner cutter and bender translate in unison. Preferably, the cylinders 148 and 152 include caps 154 and 156, respectively which provide essentially fluid-tight seals to the cylinders. The caps 154 and 156 include ports 158 and 160, respectively, through which a fluid, such as high-pressure air from a compressor 161 and controlled by the microprocessor 118 and translater card 120 (shown in FIG. 1), can be directed in order to pneumatically translate the pistons 146 and 150 downwardly to thus effect cutting and bending of the first and second leads 18 and 20 of the part 16. The pistons 146 and 150 are then translated to their original positions by means of the springs 162 and 164, respectively.

The action of inserting the now bent leads 18 and 20 of the part 16 is accomplished using first and second inserter means which are attached to and moveable with the first and second retainers 34 and 36. Preferably, the first and second inserter means respectively comprise inserter elements 166 and 168 which are shaped for engaging the leads 18 and 20 of the part 16, inserter rods 170 and 172, and actuation means such as the push plate 174, shown in FIG. 1. As is best seen in FIG. 4, the inserter rods 172 and 174 extend through openings 176 and 178, respectively, in the caps 154 and 156 and through channels 180 and 182, respectively, in the pistons 146 and 150. The openings 176 and 178 and the channels 180 and 182 are sized in diameter just slightly larger than the diameters of the inserter rods 170 and 172 and can also include seals therein so as to virtually eliminate leakage of fluid from the cylinders 148 and 152. In order to permit the inserter rods 170 and 172 to translate independently of the pistons 146 and 150, the pistons 146 and 150 include elongated apertures 184 and 186, respectively, which provide assess to the channels 180 and 182. The inserter elements 166 and 168 include flanges 188 and 190 which are sized and shaped for being received in cavities 192 and 194 in, and thus connected to, the inserter rods 170 and 172, respectively. Thus, the inserter rods 170 and 172 and the inserter elements 166 and 168 translate together. Additionally, the inserter elements 166 and 168 are preferably retained by plates 191 and 193.

Figure 1A:
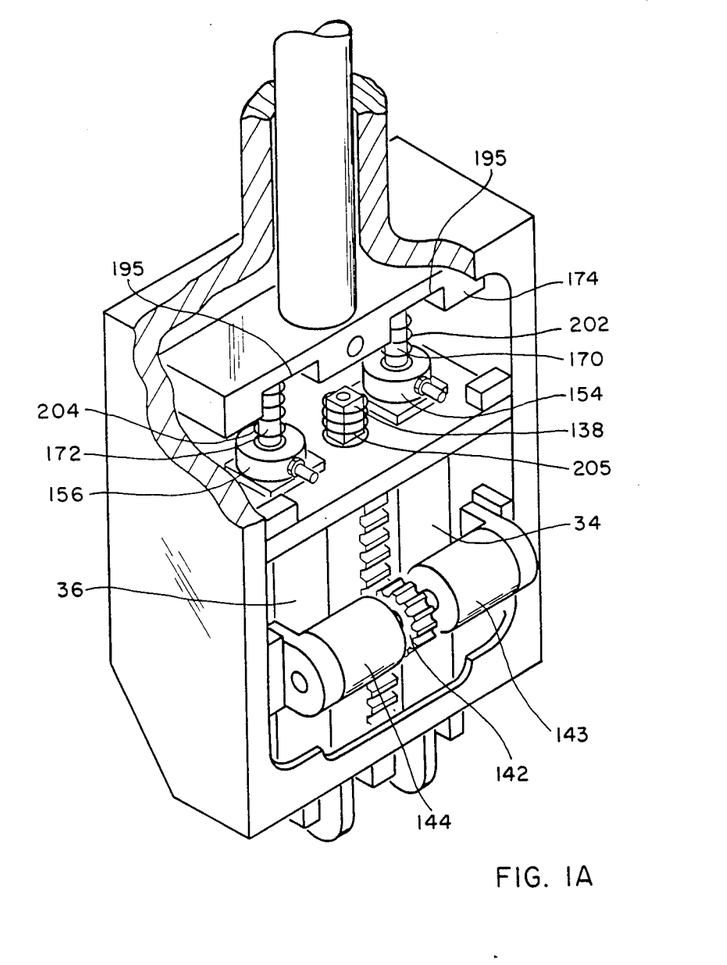

Returning to FIG'S. 1 and 1A, the upper ends of the inserter rods 170 and 172 protrude beyond the caps 154 and 156 such that they are engaged by the push plate 174. The push plate 174 preferably includes recesses 195 therein sized sufficiently large so as to accommodate the horizontal translation of the inserter rods 170 and 172 with the first and second retainers 34 and 36. The push plate 174 is translated in a vertical direction in any appropriate manner, such as, for example, by the camming arrangement shown which comprises a shaft 196 attached to the push plate 174 and which extends through the hollow tubular member 29, and arm 198 from which the shaft 196 extends, and a cam 200 upon which the arm 198 rides. Rotation of the cam 200 at a desired rotational speed results in a rhythmic up and down translation of the push plate 174. The inserter rods 170 and 172 further include springs 202 and 204 which urge the upper ends of the rods to press against the push plate 174 and thus provide the upward translational force to the rods. The microprocessor 118 controls the rotational speed of the cam 200 as well as of the cam 240 (to be described hereinafter). The upper end of the rack 138 also extends to the push plate 174 such that the push plate provides vertical translation to the rack. The rack 138 can also include a spring 205 to return the rack to its original position.

The configuration shown in FIG'S. 1 and 1A permits vertical positioning not only of the push plate 174 but also of the entire inserter assembly 12, thereby allowing more space for repositioning of boards 22 underneath the inserter assembly. The tubular member 29 extends through the fixed structure 201 to a position below a flange 203 extending radially from the inner shaft 196, the flange 203 having a diameter larger than that of the hollow tubular member 29. The tubular member 29 is translatable within the fixed structure 201. As the shaft 196 is translated downwardly in the manner described above, the tublar member 29 remains stationary until it is engaged by the flange 203. The tubular member 29 and shaft 196 then are translated in unison to a lower stopping point. The full insertion of the first and second leads 18 and 20 into the holes 28 in the board 22 is accomplished during this final translation. As the shaft 196, and thus the push plate 174, is then translated upwardly as described earlier, the push plate 174 first releases the inserter rods 170 and 172 and then engages the inner upper surface of the support frame 27, pulling the support frame including the tubular member 29 and inserter assembly 12 upwardly away from the board 22. The lower stopping point mentioned above can include a variable depth-stop arrangement which permits adjustment of the lower stopping point of the inserter assembly 12 to accommodate various thicknesses of parts 16. The depth-stop arrangement shown comprises a motor 207, which is controlled by a signal from the microprocessor 118 and translator card 120, and which is mounted on the arm 198 and a stopper 209 which is connected with and positioned vertically by the motor 207. The stopper 209 is positioned above the fixed structure 201 such that when the stopper engages the fixed structure, further downward movement of the arm 198, and thus of the shaft 196 and tubular member 29, is prevented. Vertical adjustment of the stopper 209 by the motor 207 permits adjustment of the lower stopping point.

Turning now to FIG. 6, the anvil assembly 14 preferably includes components which perform final cutting and clinching of the leads 18 and 20 of a part 16 after the leads have been inserted through a board 22. Any suitable cutting and clinching arrangements can be employed and the following arrangements are presented as examples only.

The anvil assembly 14 includes first final cutting means and first clinching means mounted on and thus translatable with the first head 72 and second final cutting means and second clinching means mounted on and thus translatable with the second head 74. Although they could be separate if desired, FIG. 6 shows the first final cutting means and first clinching means and the second final cutting means and second clinching means as comprising a first cutter-clincher 206 and a second cutter-clincher 208, respectively, which are configured to perform both the cutting and clinching functions. The first and second cutter-clinchers 206 and 208 are configured to pivot upon actuation toward the leads 18 and 20 and each includes a blade portion 210 and 212, respectively, for cutting the leads 16 and 18 and a beveled portion 214 and 216, respectively, for clinching the leads. The first and second heads 72 and 74 also include rigidly attached thereto first and second shear surfaces 218 and 220, respectively, against the edges of which the excess lengths of the first and second leads 18 and 20 abut and across which the blade portions 210 and 212 of the first and second cutter-clinchers 206 and 208 slide to cut the leads. The first and second cutter-clinchers 206 and 208 are attached to or are integral with the upper portions of first and second holders 222 and 224, respectively, which are pivotally connected, such as with pivot pins 226 and 228, with the first and second neads 72 and 74, respectively.

The anvil assembly 14 includes means for pivoting the first and second holders and cutter-clinchers 222, 224, 206 and 208, respectively, which preferably comprises an elongated clinch rail 230 moveably disposed within a groove 231 in the base 70 and extending parallel to the spindle 76 and an actuation rod 232 which extends to and abuts the bottom of the clinch rail 230 through an opening 234 in the base 70. The first and second holders 222 and 224 preferably include rollers 236 and 238, respectively, which are positioned to ride on the upper surface of the clinch rail 230. Briefly referring to FIG. 1, there is shown an example of suitable means for effecting vertical translation of the actuation rod 232. A cam 240 is rotated at a rotational speed determined by the microprocessor 118 while a follower 242 is attached to and effects vertical translation of the actuation rod 232 as the cam 240 rotates.

Returning to FIG. 6, as the clinch rail 230 is moved upwardly by the actuation rod 232, the lower portions of the first and second holders 222 and 224, which are angled outwardly away from the center of the anvil assembly 14, are pivoted outwardly about the pivot pins 226 and 228 while the first and second cutter-clinchers 206 and 208 are pivoted inwardly toward the first and second shear surfaces 218 and 220. The blade portions 210 and 212 of the first and second cutter-clinchers 206 and 208 cut the excess length of the first and second leads 18 and 20 while the beveled portions 214 and 216 clinch the remainders of the leads 18 and 20 toward the bottom face 26 of the board 22 in order to attach the part 16 to the board 22. Preferably, the anvil assembly 14 includes resilient means, such as the springs 244 and 246 extending between the lower portions of the first and second holders 222 and 224 and the first and second heads 72 and 74, respectively, which return the first and second holders to their original positions when the actuation rod 232 translates downwardly.

It is to be understood that this invention is not limited to the particualr embodiment disclosed, and it is intended to cover all modifications coming within the true spirit and scope of this invention as claimed.

What is claimed is:

1. A variable center distance insertion device for attaching varying sized parts having first and second axial leads extending therefrom to a board having top and bottom faces and holes therethrough comprising:

(a) an inserter assembly located adjacent the top face of the board and comprising:
  (1) a body;
  (2) a first retainer and a second retainer connected with said body in a manner for being translatable bidirectionally relative to each other and to said body for thereby enabling positioning of said first and said second retainers adjacent said holes into which said first and said second leads are to be inserted;
  (3) means for selectively translating said first and said second retainers such that a wide variety of different part sizes can be dealt with;
  (4) first bending means and second bending means connected to said first and said second retainers, respectively, for bending said first and said second leads resectively; and
  (5) first inserter means and second inserter means mounted on said first and said second retainers, respectively, for inserting said first and said second leads, respectively, into designated holes in the board;
(b) an anvil assembly located adjacent the bottom face of the board and comprising:
  (1) a base;
  (2) a first head and a second head connected with said base in a manner for being translatable bidirectionally relative to each other and to said base for thereby enabling positioning of said first and said second heads adjacent said holes into which said first and said second leads are inserted;
  (3) means for selectively translating said first and said second heads; and
  (4) first cutting and clinching means and second cutting and clinching means mounted on said first and said second heads, repsectively, for cutting and then clinching said first and said second leads, respectively, towards said bottom face of said board; and
(c) synchronizing means for enabling simultaneous translation of said first retainer with said first head and of said second retainer with said second head.

2. The device of claim 1 wherein said inserter assembly further comprises first initial cutting means and second initial cutting means connected to and translatable with said first and said second retainers, respectively, for cutting said first and said second leads, respectively, to initial lengths.

3. The device of claim 2 wherein said anvil assembly further comprises first final cutting means and second final cutting means mounted on said first and said second heads, respectively, for cutting said first and said second leads, respectively, to final lengths.

4. The device of claim 1 wherein said means for selectively translating said first and said second retainers and said means for selectively translating said first and said second heads each comprises an arrangement of a motor, a threaded spindle and nuts.

5. The device of claim 4 wherein each said spindle includes left hand threaded and right hand threaded portions, wherein said first retainer and said first head each includes one of said nuts attached thereto having threads matching one of said threaded portions of said spindle, said second retainer and said second head each includes another of said nuts attached thereto having threads matching the other of said threaded portions of said spindle, and whereby rotation of each said spindle by each said motor effects translation of said first and said second retainers in opposite directions and of said first and said second heads in opposite directions.

6. The device of claim 5 wherein each said motor is electric and wherein said synchronizing means comprises a microprocessor and translator card arrangement with electrical signals to each said motor.

7. The device of claim 3 wherein said first bending means and said second bending means each comprises a piston, a bender connected to and translatable with said piston, and a pivotable arm pivotally connected with said first or said second retainer, each said arm being configured for being positioned during a bending action such that said first or said second lead of said part extends across said arm for enabling said lead to be engaged by said bender for bending said lead over said arm, said arm then being positioned away from said lead for permitting insertion of said lead into said board.

8. The device of claim 7 wherein said piston is pneumatically operated.

9. The device of claim 8 wherein the interiors of said first and said second retainers each defines a cylinder sized for receiving said piston.

10. The device of claim 7 wherein each said arm is positioned against a cam, said cam effecting pivotal positioning of each said arm.

11. The device of claim 7 wherein said first initial cutting means and said second initial cutting means each comprises a stationary outer cutter and a translatable inner cutter, said outer cutter including a cutting edge across which said first lead or said second lead lies, said inner cutter being configured for translating adjacent said cutting edge of said outer cutter for thereby engaging and shearing said first or said second lead.

12. The device of claim 11 wherein said inner cutter is connected with said bender for thereby being translatable with said piston.

13. The device of claim 7 wherein said first inserter means and said second inserter means each comprises an inserter element shaped for engaging one of said leads, an inserter rod attached to said inserter element, and actuation means for effecting movement of said inserter rod.

14. The device of claim 13 wherein said piston includes a cylindrical opening therethrough sized for receiving said inserter rod in a manner whereby said piston and said inserter rod can move independently.

15. The device of claim 7 wherein said first final cutting means and said first clinching means comprise a first cutter-clincher pivotally connected with said first head and a first shear surface rigidly attached with said first head and said second final cutting means and said second clinching means comprise a second cutter-clincher pivotally connected with said second head and a second shear surface rigidly attached with said second head, and further comprising means for pivoting said first and said second cutter-clinchers toward said first and said second shear surfaces against edges of which said first and said second leads, respectively, abut for thereby both cutting said first and said second leads and clinching said first and said second leads toward said bottom face of said board.

16. A variable center distance insertion device for attaching varying sized components having first and second axial leads extending therefrom to a board having top and bottom faces and hole therethrough comprising:
  (a) an inserter assembly having a body and located above the top face of the board and comprising:

a first retainer and a second retainer having bending means and connected with said body in a manner for being translatable relative to each other and to said body for thereby enabling positioning of said first and said second retainers adjacent the holes into which the first and second component leads are to be inserted; first inserter means and second inserter means mounted on said first and said second retainers, respectively, for inserting such first and said second leads, respectively, into the holes in the board;

means for selectively translating said first and second retainers bidirectionally;

(b) an anvil assembly having a base and located below the bottom face of the board and comprising:

a first head and a second head having cutting and clinching means and connected with said base in a manner for being translatable relative to each other and to said base for thereby enabling positioning of said first and said second heads adjacent the holes into which the first and said second leads are inserted;

means for selectively translating said first and said second heads bidirectionally, such that cutting and clinching of the leads below the bottom face of the board can be accomplished; and means for synchronizing the operation of said means for selectively translating said first and second retainers and said means for selectively translating said first and second heads, whereby the leads of an axial lead component can be bent, inserted, cut and clinched automatically.

17. The insertion device of claim 16 wherein said means for selectively translating said first and said second retainers and said means for selectively translating said first and said second heads each comprise an arrangement of a motor, a threaded spindle driven in rotation for translation by the motor, and threaded means for engaging the threades of said spindle.

18. The device of claim 17 wherein each said threaded spindles includes left hand threaded and right hand threaded portions, and wherein said first retainer and said first head each includes means having threads matching one of said threaded portions of the respective spindle, said second retainer and said second head each including another means having threads matching the other of said threaded portions of the respective spindle, whereby rotation of each said spindles by the respective motor selectively effects translation of said first and said second retainers in opposite directions, and translation of said first and said second heads in opposite directions.

19. The device of claim 17 wherein each said motor is electric and wherein said synchronizing means comprises a microprocessor and translator card arrangement, with appropriate electrical signals provided to each said motor.

20. The device of claim 17 wherein each said spindle includes left hand threaded and right hand threaded portions, and wherein said first retainer and said first head each includes portions having threads matching one of said threaded portions of the respective spindle, said second retainer and said second head each including portions having threads matching the other of said threaded portions of the respective spindle, and motor means for effecting translation of said first and said second retainers in opposite directions, and said first and said second heads in opposite directions synchronously with said retainers.

21. A variable center distance component insertion device designed to insert axial lead components of a wide variety of sizes into designated pairs of holes in a circuit board containing a large number of holes, said device comprising:

an inserter assembly and an anvil assembly, with said inserter assembly located above said anvil assembly and operatively connected thereto, with a space designed to receive a circuit board located between said inserter assembly and said anvil assembly, said inserter assembly comprising first and second retainer means having portions serving to grasp a selected axial lead component, bend the leads thereof, and thereafter insert such leads into a designated pair of holes in the printed circuit board, bidirectional means for moving said first and second retainer means incrementally in translation in either direction to an unlimited range of positions within the maximum and minimum limits of the device, so that a component of any of a wide size variation can be grasped, and its leads bent and inserted, said anvil assembly being located below the circuit board and comprising first and second heads movable in translation, and control means for assuring the translation of said first and second heads in synchronism with translatory movements of said first and second retainer means, respectively, said heads containing cutting and clinching means so that the leads of the selected component after lead insertion can be automatically cut and clinched.

22. The component insertion device as recited in claim 21 in which said control means for translating said first and second heads in synchronism with translatory movements of said first and second retainer means includes a microprocessor.

23. A variable center distance component insertion device for installing axial lead components of a wide variety of sizes in designated pairs of holes in circuit boards, said component insertion device comprising an inserter assembly having a first retainer and a second retainer, with said retainers being relatively movable bidirectionally in translation, and an anvil assembly located a spaced distance below said inserter assembly, and having first and second heads relatively movable in translation in synchronism with the translatory movements of said first and second retainers, with a circuit board arranged to receive axial lead components being accommodated between said inserter assembly and said anvil assembly, said first and second retainers of said inserter assembly each comprising lead grasping and bending means as well as lead inserting means, said first and second heads of said anvil assembly each comprising cutoff means and clinching means, said first head being located below said first retainer, and said second head being located below said second retainer, and control means for accomplishing incremental translatory movements of said first and second retainers in synchronism with incremental translatory movements of said heads such that the leads of an axial lead component inserted through a designated pair of holes in the circuit board can thereafter by automatically cut and clinched by components of said first and second heads.

24. The device as recited in claim 23 in which said control means includes the use of a microprocessor.

25. A variable center distance component insertion device for installing axial lead components of a wide variety of sizes in designated pairs of holes in circuit boards, said component insertion device comprising an inserter assembly having a first retainer and a second retainer located directly above a circuit board having a number of holes therein, said retainers being movable incrementally in translation bidirectionally such that the leads of a component selected from a wide variety of component sizes can be grasped, bent, and thereafter inserted in a designated pair of holes in the circuit board, said component insertion device also comprising an anvil assembly located below the circuit board and having first and second heads located respectively below said first retainer and said second retainer, with said heads each having cutting and clinching means, and means for moving said first head synchronously in translation with the translation of said first retainer, and said second head synchronously in translation with the translation of said second retainer to an unlimited range of positions within the maximum and minimum limits of the device, whereby the leads of a selected axial lead component can be grasped, bent, inserted in a selected pair of holes, cut to length, and thereafter clinched entirely automatically.

26. The device as recited in claim 25 in which control means including the use of a microprocessor are utilized for accomplishing the translatory movements of said first and second retainers in synchronism with the translatory movements of said first and second heads.

* * * * *